United States Patent
Cornfeld et al.

(10) Patent No.: US 10,026,860 B2
(45) Date of Patent: *Jul. 17, 2018

(54) METAMORPHIC LAYERS IN MULTIJUNCTION SOLAR CELLS

(71) Applicant: SolAero Technologies Corp., Albuquerque, NM (US)

(72) Inventors: Arthur Cornfeld, Sandia Park, NM (US); Mark A. Stan, N.E. Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 777 days.

This patent is subject to a terminal disclaimer.

(21) Appl. No.: 13/956,122

(22) Filed: Jul. 31, 2013

(65) Prior Publication Data

US 2013/0312818 A1    Nov. 28, 2013

Related U.S. Application Data

(63) Continuation of application No. 12/758,390, filed on Apr. 12, 2010, now Pat. No. 8,536,446, which is a (Continued)

(51) Int. Cl.
*H01L 31/00* (2006.01)
*H01L 31/06* (2012.01)
(Continued)

(52) U.S. Cl.
CPC ........ *H01L 31/06* (2013.01); *H01L 31/03046* (2013.01); *H01L 31/0693* (2013.01);
(Continued)

(58) Field of Classification Search
CPC ............... H01L 31/03046; H01L 31/06; H01L 31/06875; H01L 31/0693; H01L 31/184; H01L 31/1844; Y02E 10/544
(Continued)

(56) References Cited

U.S. PATENT DOCUMENTS 3,488,834 A    1/1970  Baird
3,990,097 A *  11/1976 Lindmayer ..... H01L 31/022425
                                                  136/255
(Continued)

FOREIGN PATENT DOCUMENTS

GB    2346010    7/2000
JP    60-160181  8/1985
(Continued)

OTHER PUBLICATIONS

Lewis et al., "The crystallographic connection of MOCVD-grown monolithic cascade subcells via transparent graded layers," J. of Crystal Growth, vol. 69, pp. 515-526 (1984).
(Continued)

*Primary Examiner* — Thanh Truc Trinh

(57) ABSTRACT

A method of forming a multijunction solar cell comprising an upper subcell, a middle subcell, and a lower subcell comprising providing first substrate for the epitaxial growth of semiconductor material; forming a first solar subcell on said substrate having a first band gap; forming a second solar subcell over said first subcell having a second band gap smaller than said first band gap; and forming a grading interlayer over said second sub cell having a third band gap larger than said second band gap forming a third solar subcell having a fourth band gap smaller than said second band gap such that said third subcell is lattice mis-matched with respect to said second subcell.

9 Claims, 17 Drawing Sheets

Related U.S. Application Data continuation of application No. 11/445,793, filed on Jun. 2, 2006, now Pat. No. 8,536,445.

(51) Int. Cl.
*H01L 31/0304* (2006.01)
*H01L 31/0687* (2012.01)
*H01L 31/0693* (2012.01)
*H01L 31/18* (2006.01)

(52) U.S. Cl.
CPC ...... *H01L 31/06875* (2013.01); *H01L 31/184* (2013.01); *H01L 31/1844* (2013.01); *Y02E 10/544* (2013.01)

(58) Field of Classification Search
USPC .................... 136/252, 255, 256, 262, 261
See application file for complete search history.

(56) References Cited

U.S. PATENT DOCUMENTS

| | | | |
|---|---|---|---|
| 4,001,864 A | | 1/1977 | Gibbons |
| 4,338,480 A | | 7/1982 | Antypas et al. |
| 4,759,803 A | | 7/1988 | Cohen |
| 4,881,979 A | | 11/1989 | Lewis |
| 5,009,720 A | | 4/1991 | Hokuyo et al. |
| 5,019,177 A | | 5/1991 | Wanlass |
| 5,053,083 A | | 10/1991 | Sinton |
| 5,322,572 A | | 6/1994 | Wanlass |
| 5,342,453 A | | 8/1994 | Olson |
| 5,376,185 A | | 12/1994 | Wanlass |
| 5,405,453 A | | 4/1995 | Ho et al. |
| 5,510,272 A | | 4/1996 | Morikawa et al. |
| 5,944,913 A | | 8/1999 | Hou et al. |
| 6,103,970 A | | 8/2000 | Kilmer et al. |
| 6,107,213 A | * | 8/2000 | Tayanaka .......... H01L 21/02381 257/E21.216 |
| 6,239,354 B1 | | 5/2001 | Wanlass |
| 6,252,287 B1 | | 6/2001 | Kurtz et al. |
| 6,278,054 B1 | | 8/2001 | Ho et al. |
| 6,281,426 B1 | | 8/2001 | Olson et al. |
| 6,300,557 B1 | | 10/2001 | Wanlass |
| 6,300,558 B1 | | 10/2001 | Takamoto et al. |
| 6,316,716 B1 | | 11/2001 | Hilgrath |
| 6,326,540 B1 | | 12/2001 | Kilmer et al. |
| 6,340,788 B1 | * | 1/2002 | King .................. H01J 37/3023 136/255 |
| 6,359,210 B2 | | 3/2002 | Ho et al. |
| 6,372,980 B1 | | 4/2002 | Freundlich |
| 6,452,086 B1 | | 9/2002 | Muller |
| 6,482,672 B1 | | 11/2002 | Hoffman et al. |
| 6,600,100 B2 | | 7/2003 | Ho et al. |
| 6,660,928 B1 | | 12/2003 | Patton et al. |
| 6,680,432 B2 | | 1/2004 | Sharps et al. |
| 6,951,819 B2 | | 10/2005 | Iles et al. |
| 7,071,407 B2 | | 7/2006 | Fatermi et al. |
| 2002/0040727 A1 | | 4/2002 | Stan et al. |
| 2002/0164834 A1 | | 11/2002 | Boutros et al. |
| 2003/0070707 A1 | | 4/2003 | Kings et al. |
| 2003/0140962 A1 | | 7/2003 | Sharps et al. |
| 2003/0145884 A1 | | 8/2003 | King et al. |
| 2004/0045598 A1 | | 3/2004 | Narayanan et al. |
| 2004/0079408 A1 | * | 4/2004 | Fetzer ............ H01L 31/184 136/262 |
| 2004/0166681 A1 | | 8/2004 | Iles et al. |
| 2004/1049331 | | 8/2004 | Sharps et al. |
| 2005/0274411 A1 | | 12/2005 | King et al. |
| 2006/0144435 A1 | | 7/2006 | Wanlass |
| 2006/0162768 A1 | | 7/2006 | Wanlass |
| 2006/0234065 A1 | * | 10/2006 | Ohno ................. C01G 15/00 428/432 |
| 2008/0179702 A1 | | 7/2008 | Nasuno et al. |
| 2010/0269895 A1 | | 10/2010 | Smith et al. |
| 2012/0180854 A1 | | 7/2012 | Bellanger et al. |
| 2012/0247547 A1 | | 10/2012 | Sasaki et al. |

FOREIGN PATENT DOCUMENTS

| | | |
|---|---|---|
| JP | H06-061521 A | 3/1994 |
| JP | 09-64397 | 3/1997 |
| JP | 2000-223736 A | 8/2000 |
| JP | 2001-111039 A | 4/2001 |
| JP | 2002-329878 | 11/2002 |
| JP | 2004-319934 | 11/2004 |
| JP | 2004-327889 A | 11/2004 |
| JP | 2005-516414 A | 6/2005 |
| JP | 2005-535148 A | 11/2005 |
| JP | 2005-347402 | 12/2005 |
| JP | 2008-186953 | 8/2008 |
| JP | 2009-177220 | 8/2009 |
| JP | 2010-067920 | 3/2010 |
| JP | 2010-067921 | 3/2010 |
| JP | 4868746 B | 11/2011 |
| JP | 5038459 B2 | 7/2012 |
| JP | 2012-151471 | 8/2012 |
| JP | 2013-021057 | 1/2013 |
| JP | 5215284 B | 3/2013 |
| JP | 2013-062360 | 4/2013 |
| WO | 96/18213 | 6/1996 |
| WO | 99/62125 | 2/1999 |
| WO | 2013/038822 | 3/2013 |

OTHER PUBLICATIONS

Lewis et al., "Recent developments in multijunction solar cell research," J. Solar Cells, vol. 24, pp. 171-183 (1988).
Aiken et al., "Consideration of high bandgap subcells for advanced multijunction solar cells", Conf. Record of 2006 IEEE 4th World Conf. on Photovoltaic Energy Conversion, pp. 838-841 (2006).
Schultz, et al., "High efficiency 1.0 eV GaInAs bottom solar cell for 3-junctionmonolithic stack", pp. 148-152 (May 21, 1990).
Sexl et al., "MBE Growth of Metamorphic In(Ga)AlAs Buffers", IEEE, pp. 49-52 (1998).
Sinharov, et al., "Progress in the Development of Metamorphic Multi-Junction III-V Space Solar Cells", Prog. Photovolt. Res. Appl., 10:427-432 (2002).
Venkatasubramanian et al., "An Inverted-Growth Approach to Development of an IR-Transparent, High-Efficiency Al GaAs/GaAs Cascade Solar Cell", IEEE, pp. 93-98.
Wanlass, et al., "Monolithic Ultra-thin GaInP/GaAs/GaInAs Tandem Solar Cells", Conf. Record of 2006 IEEE 4th World Conf. on Photovoltaic Energy Conversion, pp. 729-732 (2006).
Wanlass et al., "Lattice-Mismatched Approaches for High-Performance, III-V Photovoltaic Energy Converters", IEEE, pp. 530-535 (2005).
Search Report for European Patent Application No. 06024750.9 (dated Oct. 26, 2012).
Rule 132 Declaration of Mark W. Wanlass, U.S. Appl. No. 11/027,156, dated Jul. 31, 2010.
Rule 132 Declaration of Noren Pan, U.S. Appl. No. 11/027,156, dated Nov. 4, 2010.
Rule 132 Declaration of Rama Venkatsubramanian, U.S. Appl. No. 11/027,156, dated Nov. 9, 2010.
Rule 132 Declaration of Sarah Kurtz, U.S. Appl. No. 11/027,156, dated Jul. 31, 2010.

* cited by examiner

METAMORPHIC LAYERS IN MULTIJUNCTION SOLAR CELLS

This application is a continuation and claims the benefit of priority of U.S. application Ser. No. 12/758,390, filed Apr. 12, 2010, which is a continuation and claims the benefit of priority of U.S. application Ser. No. 11/445,793, filed Jun. 2, 2006. The disclosures of the previous applications are incorporated herein by reference.

GOVERNMENT RIGHTS STATEMENT

This invention was made with Government support under contract FA9453-04-2-0041 awarded by the United States Air Force. The Government has certain rights in the invention.

BACKGROUND OF THE INVENTION

1. Field of the Invention

The present invention relates to the field of solar cell semiconductor devices, and particularly to integrated semiconductor structures including a multijunction solar cell including a metamorphic layer.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated in vertical, multijunction structures, and disposed in horizontal arrays, with the individual solar cells connected together in a series. The shape and structure of an array, as well as the number of cells it contains, are determined in part by the desired output voltage and current.

Inverted metamorphic solar cell structures such as described in U.S. Pat. No. 6,951,819 and M. W. Wanless et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important starting point for the development of future commercial products. The structures described in such prior art present a number of practical difficulties relating to the appropriate choice of materials and fabrication steps, in particular associated with the lattice mismatched layers between the "lower" subcell (the subcell with the lowest bandgap) and the adjacent subcell.

Prior to the present invention, the materials and fabrication steps disclosed in the prior art have not been adequate to produce a commercial viable, manufacturable, and energy efficient solar cell.

SUMMARY OF THE INVENTION

1. Objects of the Invention

It is an object of the present invention to provide an improved multijunction solar cell.

It is an object of the invention to provide an improved inverted metamorphic solar cell.

It is another object of the invention to provide in a multi-cell structure, an interlayer between a second subcell and a third lattice-mis-matched subcell that maximizes the energy efficiency of the solar cell.

It is still another object of the invention to provide a method of manufacturing an inverted metamorphic solar cell as a thin, flexible film.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

2. Features of the Invention

Briefly, and in general terms, the present invention provides a solar cell including a semiconductor body having an upper surface; a multi junction solar cell disposed on the upper surfaces; a first solar subcell on the substrate having a first band gap; a second solar subcell disposed over the first subcell and having a second band gap smaller than the first band gap; and a grading interlayer disposed over the second subcell interlayer having a third band gap larger than the second band gap, and a third solar subcell over the second solar subcell such that the third solar subcell is lattice mismatched with respect to the second subcell and the third subcell has a fourth band gap smaller than the third band gap.

In another aspect, the present invention provides a method of forming a multijunction solar cell comprising an upper subcell, a middle subcell, and a lower subcell by providing a first substrate for the epitaxial growth of semiconductor material; forming a first solar subcell on said substrate having a first band gap; forming a second solar subcell over said first subcell having a second band gap smaller than said first band gap; and forming a grading interlayer over said second subcell having a third band gap larger than said second band gap forming said at least one lower subcell over said middle subcell such that said at least one lower subcell is lattice mis-matched with respect to said middle subcell and said third subcell has a fourth band gap smaller than said second band gap.

BRIEF DESCRIPTION OF THE DRAWINGS

These and other features and advantages of this invention will be better and more fully appreciated by reference to the following detailed description when considered in conjunction with the accompanying drawings, wherein.

DESCRIPTION OF THE PREFERRED EMBODIMENT

Figure 1:
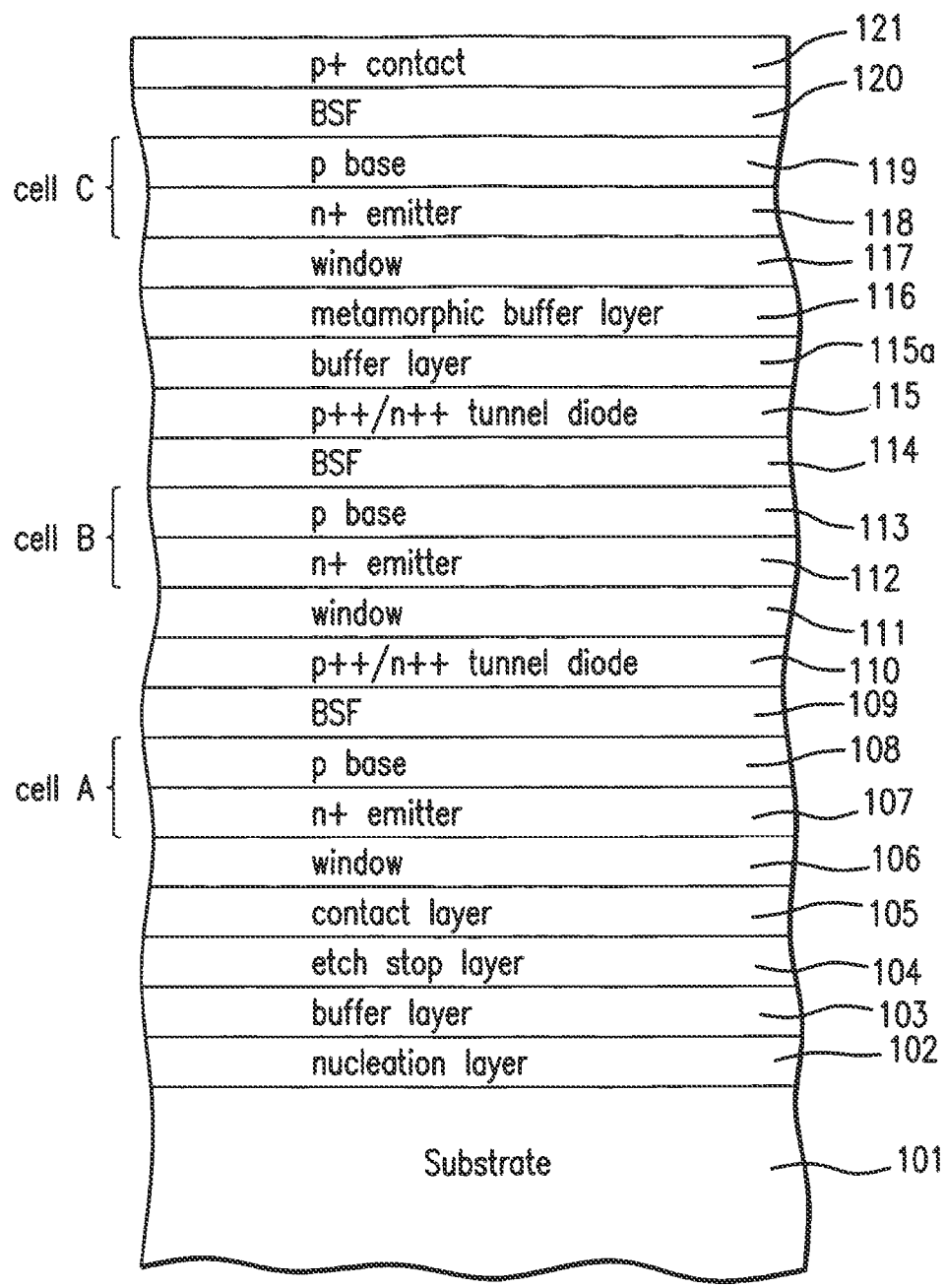
FIG. 1 is an enlarged cross-sectional view of the solar cell according to the present invention at the end of the process steps of forming the layers of the solar cell.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

FIG. 1 depicts the multijunction solar cell according to the present invention after formation of the three subcells A, B and C on a substrate. More particularly, there is shown a substrate 101, which may be either gallium arsenide (GaAs), germanium (Ge), or other suitable material. In the case of a Ge substrate, a nucleation layer 102 is deposited on the substrate. On the substrate, or over the nucleation layer 102, a buffer layer 103, and an etch stop layer 104 are further deposited. A contact layer 105 is then deposited on layer 104, and a window layer 106 is deposited on the contact layer. The subcell A, consisting of an n+ emitter layer 107 and a p-type base layer 108, is then deposited on the window layer 106.

It should be noted that the multi junction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the substrate 101 is gallium arsenide, the emitter layer 107 is composed of InGa(Al)P, and the base layer is composed of InGa(Al)P.

On top of the base layer 108 is deposited a back surface field ("BSF") layer 109 used to reduce recombination loss.

The BSF layer 109 drives minority carriers from the region near the base/BSF interface surface to minimize the effect of recombination loss. In other words, a BSF layer 109 reduces recombination loss at the backside of the solar subcell A and thereby reduces the recombination in the base.

On top of the BSF layer 109 is deposited a sequence of heavily doped p-type and n-type layers 110 which forms a tunnel diode which is a circuit element to connect cell A to cell B.

On top of the tunnel diode layers 110 a window layer 111 is deposited. The window layer 111 used in the subcell B also operates to reduce the recombination loss. The window layer 111 also improves the passivation of the cell surface of the underlying junctions. It should be apparent to one skilled in the art, that additional layer(s) may be added or deleted in the cell structure without departing from the scope of the present invention.

On top of the window layer 111 the layers of cell B are deposited: the emitter layer 112, and the p-type base layer 113. These layers are preferably composed of InGaP and $In_{0.015}GaAs$ respectively, although any other suitable materials consistent with lattice constant and band gap requirements may be used as well.

On top of the cell B is deposited a BSF layer 114 which performs the same function as the BSF layer 109. A p++/n++ tunnel diode 115 is deposited over the BSF layer 114 similar to the layers 110, again forming a circuit element to connect cell B to cell C. A buffer layer 115a, preferably InGaAs, is deposited over the tunnel diode 115, to a thickness of about 1.0 micron. A metamorphic buffer layer 116 is deposited over the buffer layer 115a which is preferably a compositionally step-graded InGaAlAs series of layers with monotonically changing lattice constant to achieve a transition in lattice constant from cell B to subcell C. The bandgap of layer 116 is 1.5 ev constant with a value slightly greater than the bandgap of the middle cell B.

In one embodiment, as suggested in the Wanless et al. paper, the step grade contains nine compositionally graded steps with each step layer having a thickness of 0.25 micron. In the preferred embodiment, the interlayer is composed of InGaAlAs, with monotonically changing lattice constant.

Figure 2:
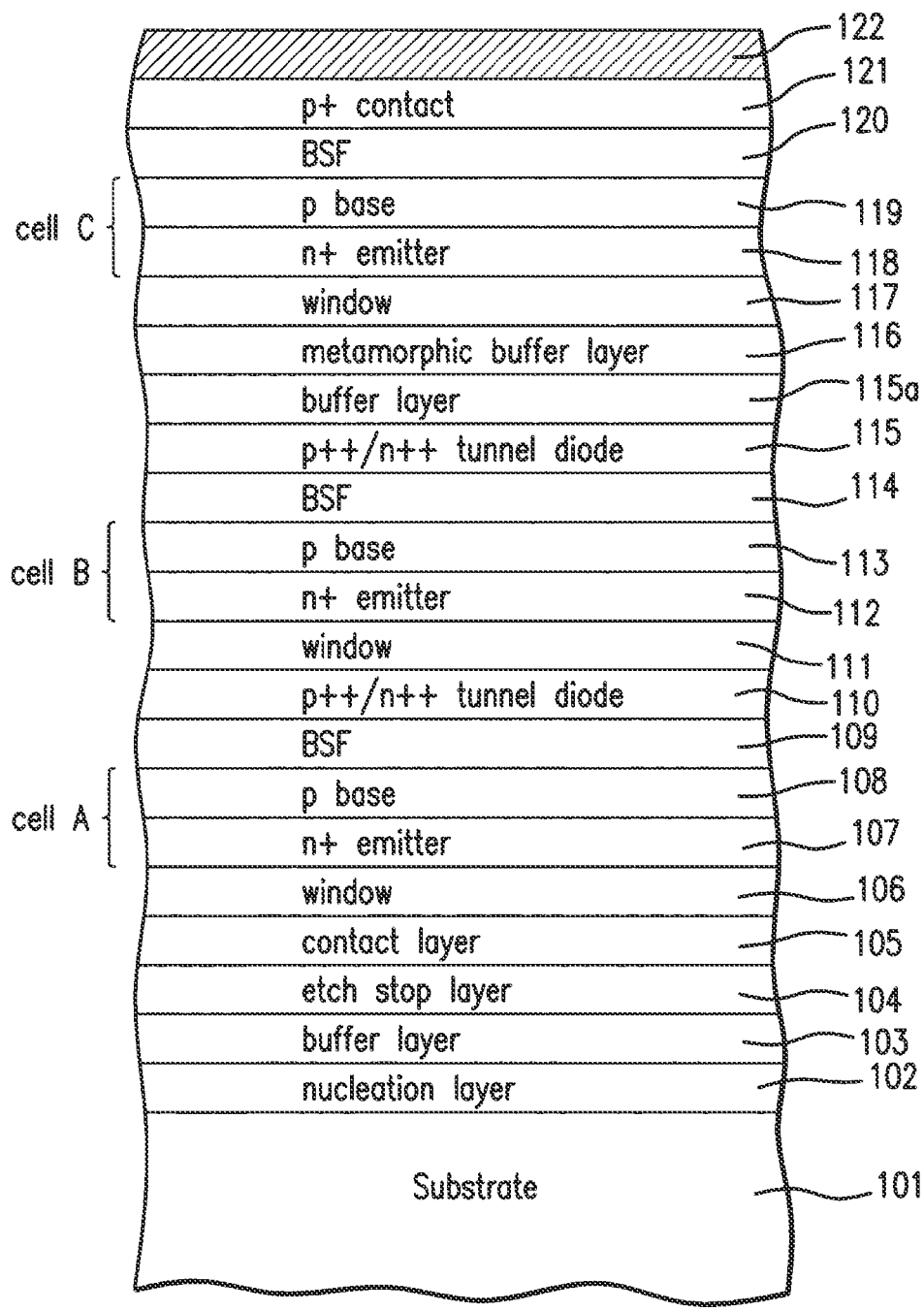
FIG. 2 is a cross-sectional view of the solar cell of FIG. 1 after the next process step according to the present invention.

FIG. 2 is a cross-sectional view of the solar cell of FIG. 1 after the next process step according to the present invention in which a metal contact layer 122 is deposited over the p+ semiconductor contact layer 121. The metal is preferably a sequence of Ti/Au/Ag/Au layers.

Figure 3:
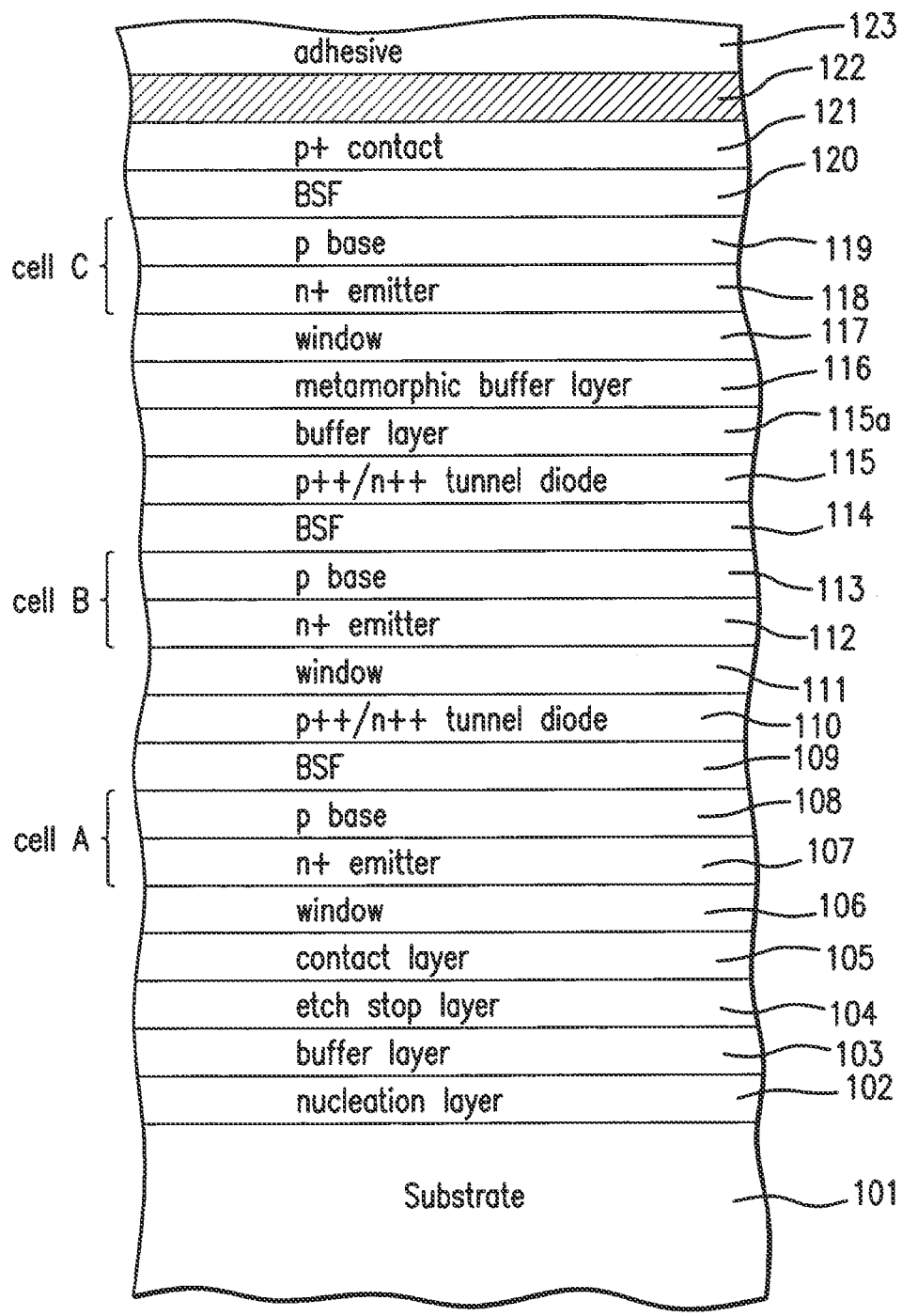
FIG. 3 is a cross-sectional view of the solar cell of FIG. 2 after the next process step according to the present invention.

FIG. 3 is a cross-sectional view of the solar cell of FIG. 2 after the next process step according to the present invention in which an adhesive layer 123 is deposited over the metal layer 122. The adhesive is preferably GenTak 330 (distributed by General Chemical Corp.).

Figure 4:
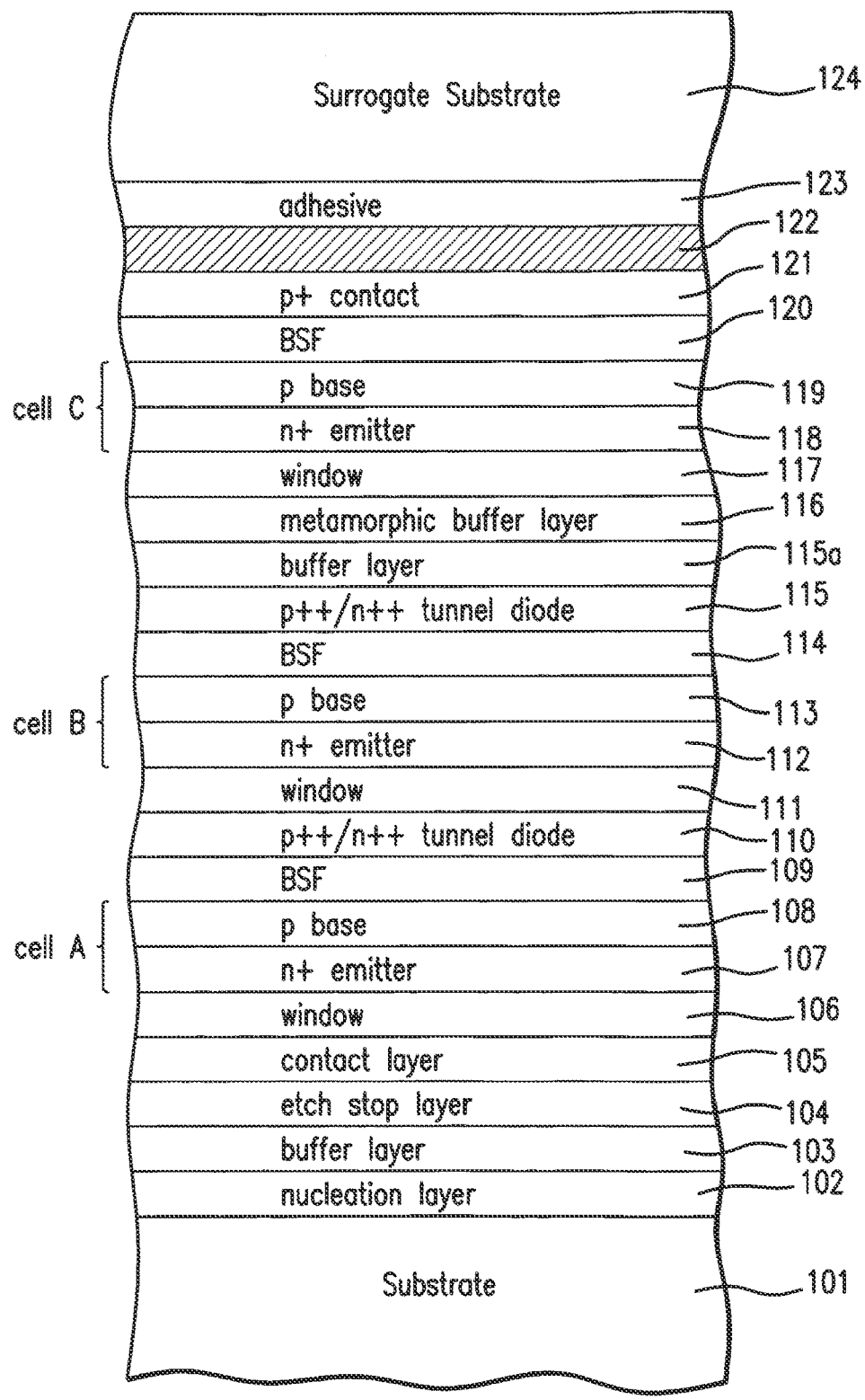
FIG. 4 is a cross-sectional view of the solar cell of FIG. 3 after the next process step according to the present invention in which a surrogate substrate is attached.

FIG. 4 is a cross-sectional view of the solar cell of FIG. 3 after the next process step according to the present invention in which a surrogate substrate, preferably sapphire, is attached. In the preferred embodiment, the surrogate substrate is about 40 mils in thickness, and is perforated with holes about 1 mm in diameter, spaced 4 mm apart, to aid in subsequent removal of the substrate.

Figure 5A:
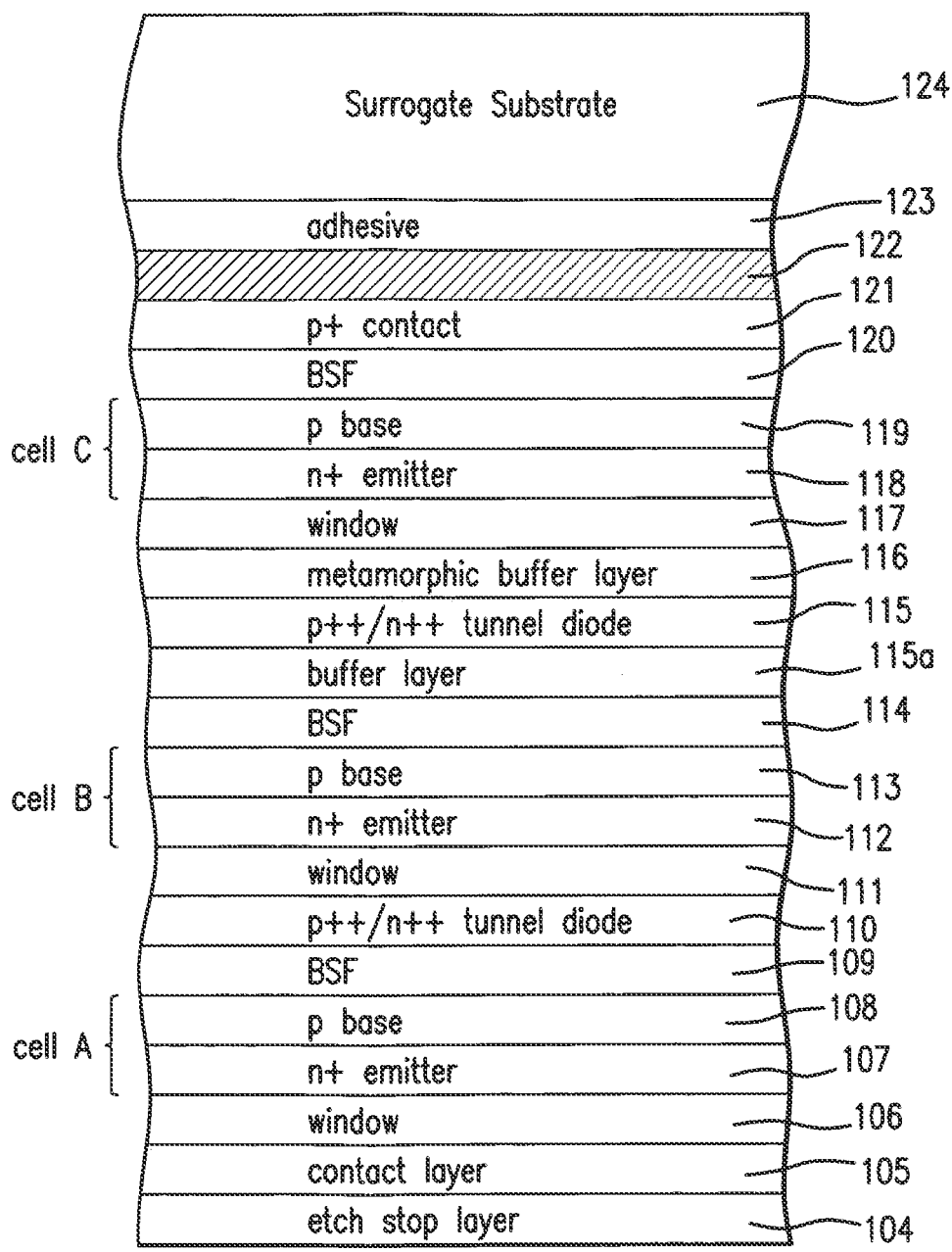
FIG. 5A is a cross-sectional view of the solar cell of FIG. 4 after the next process step according to the present invention in which the original substrate is removed.

FIG. 5A is a cross-sectional view of the solar cell of FIG. 4 after the next process step according to the present invention in which the original substrate is removed by a sequence of lapping and/or etching steps in which the substrate 101, the buffer layer 103, and the etch stop layer 104, are removed. The etchant is growth substrate dependent.

Figure 5B:
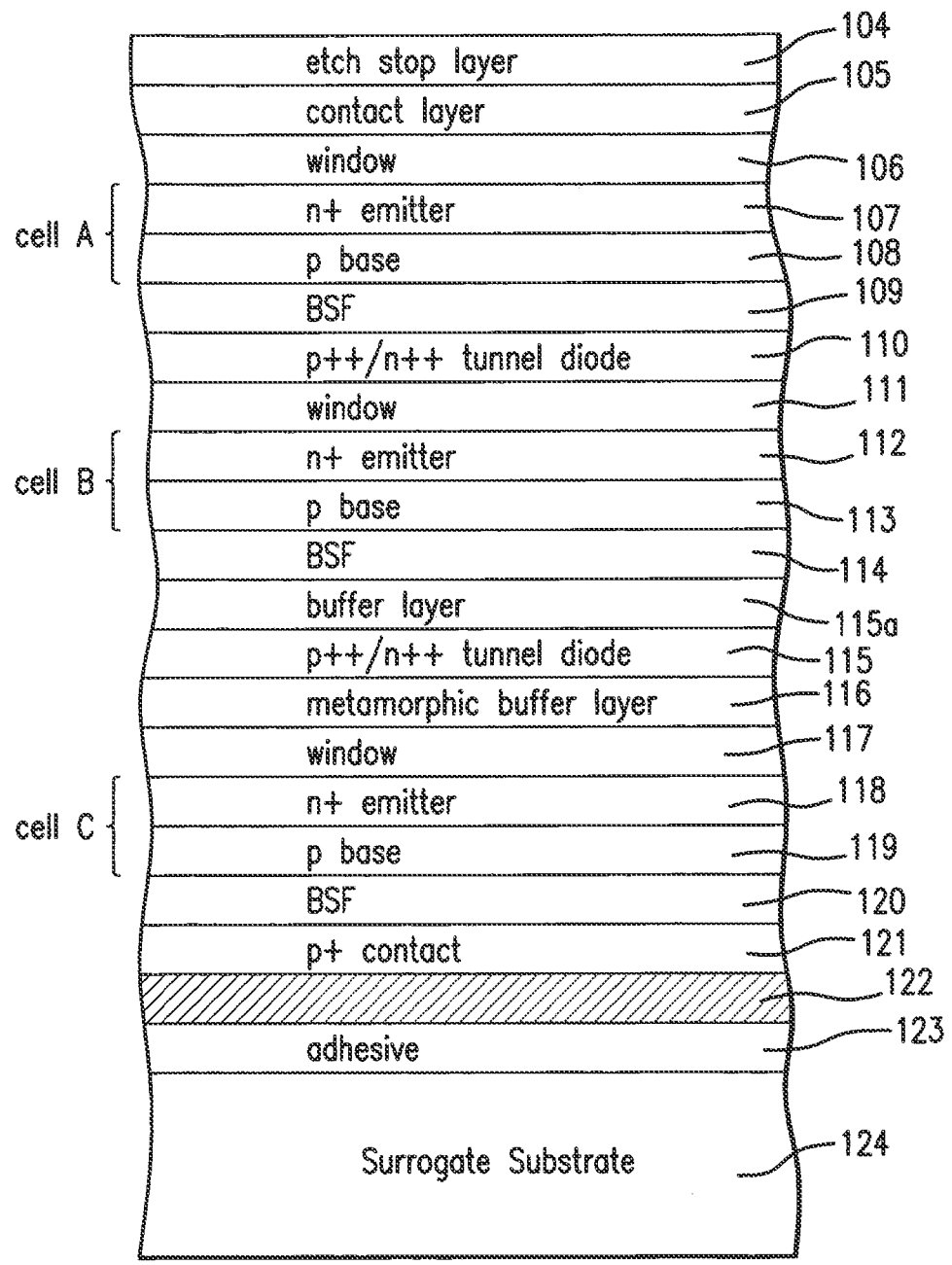
FIG. 5B is another cross-sectional view of the solar cell of FIG. 4 after the next process step according to the present invention in which the original substrate is removed.

FIG. 5B is a cross-sectional view of the solar cell of FIG. 5A from the solar cell of FIG. 5A from the orientation with the surrogate substrate 124 being at the bottom of the Figure.

Figure 6A:
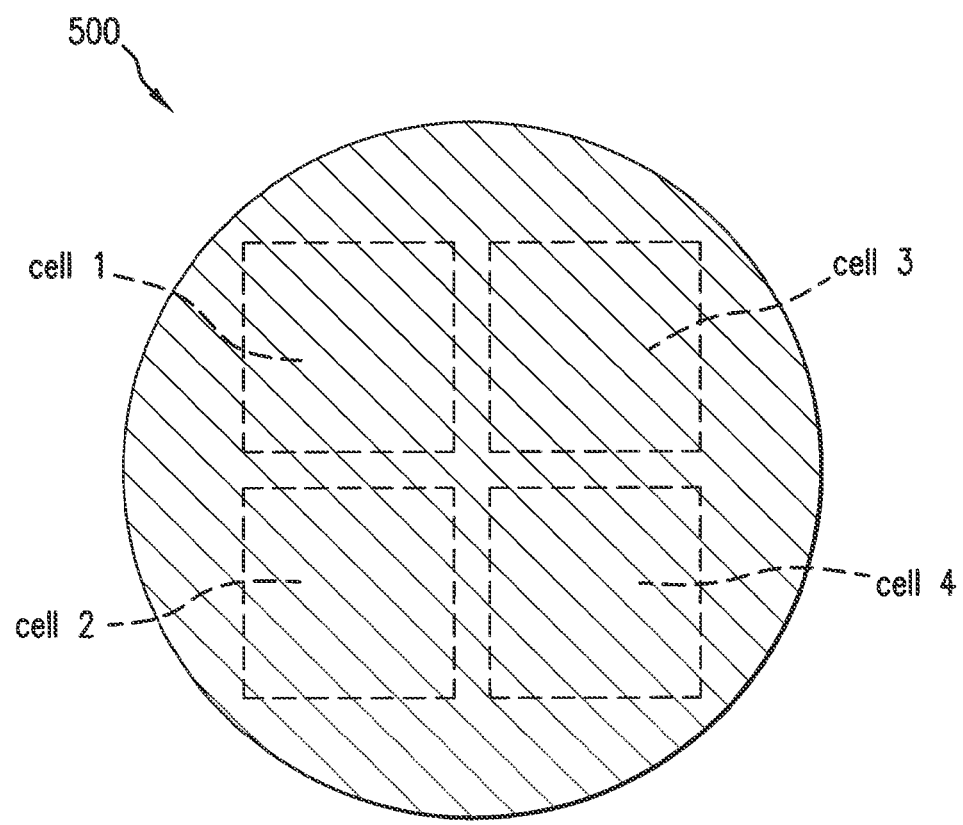
FIG. 6A is a top plan view of a wafer in which the solar cells according to the present invention are fabricated.

FIG. 6A is a top plan view of a wafer in which the solar cells according to the present invention are implemented.

Figure 6B:
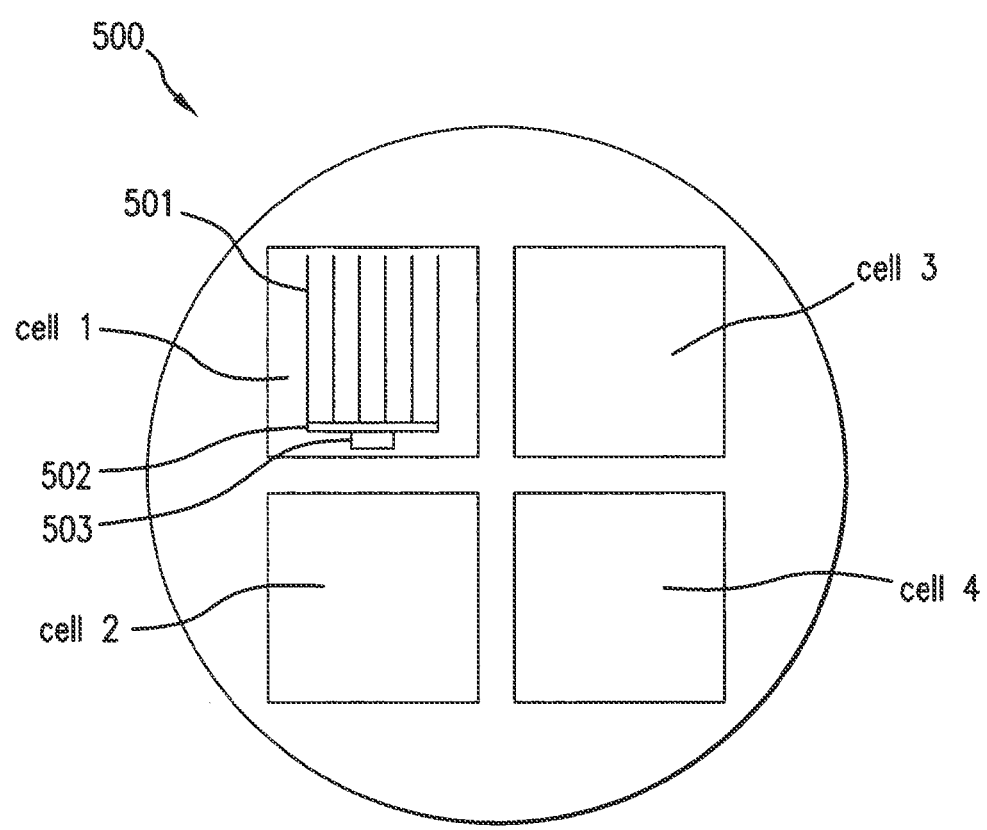
FIG. 6B is a bottom plan view of a wafer in which the solar cells according to the present invention are fabricated.

FIG. 6B is a bottom plan view of the wafer with four solar cells shown in FIG. 6A. In each cell there are grid lines 501 (more particularly shown in FIG. 10), an interconnecting bus line 502, and a contact pad 503.

Figure 7:
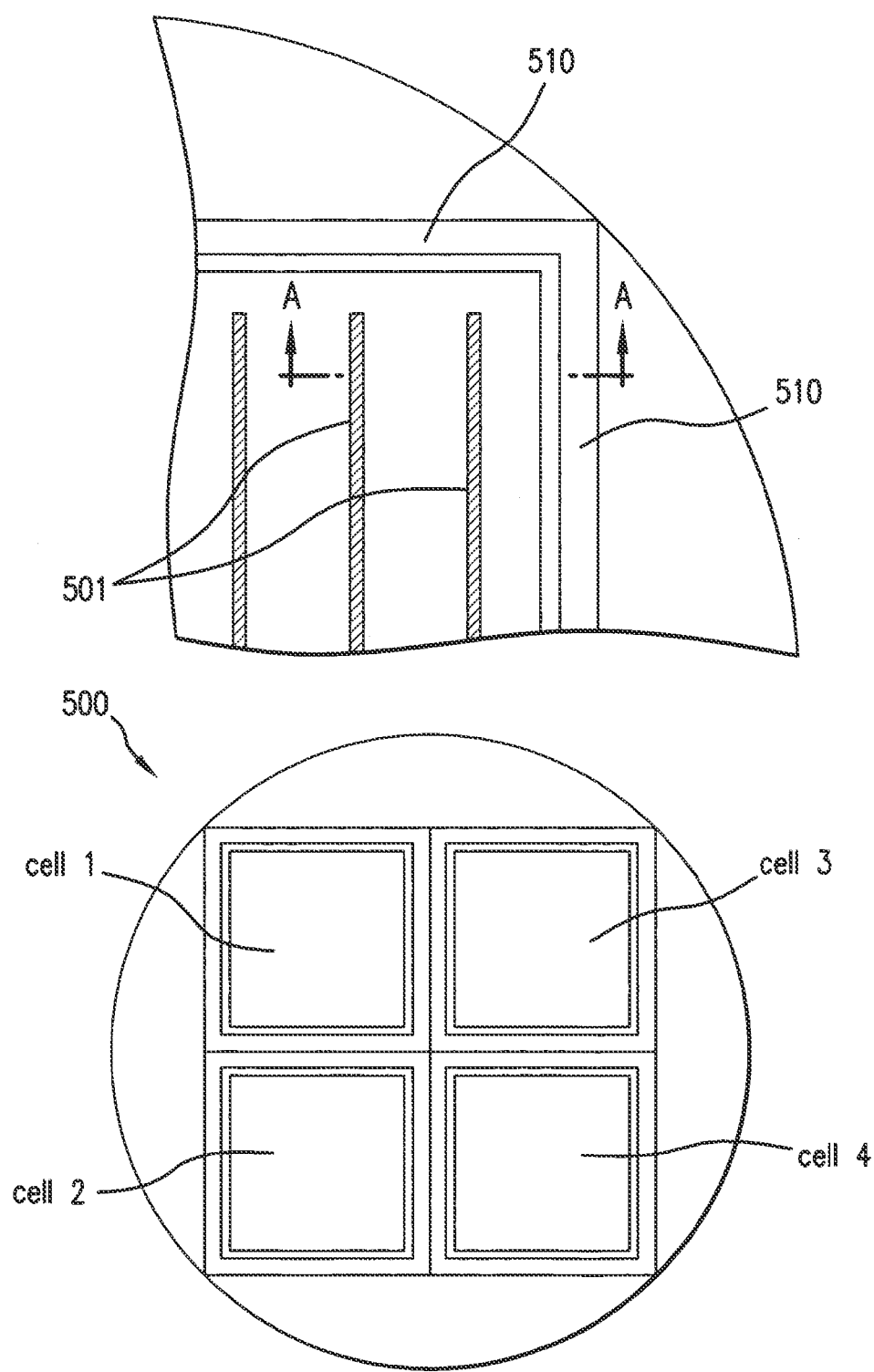
FIG. 7 is a top plan view of the wafer of FIG. 6B after the next process step according to the present invention.

FIG. 7 is a bottom plan view of the wafer of FIG. 6B after the next process step in which a mesa 510 is etched around the periphery of each cell using phosphide and arsenide etchants.

Figure 8:
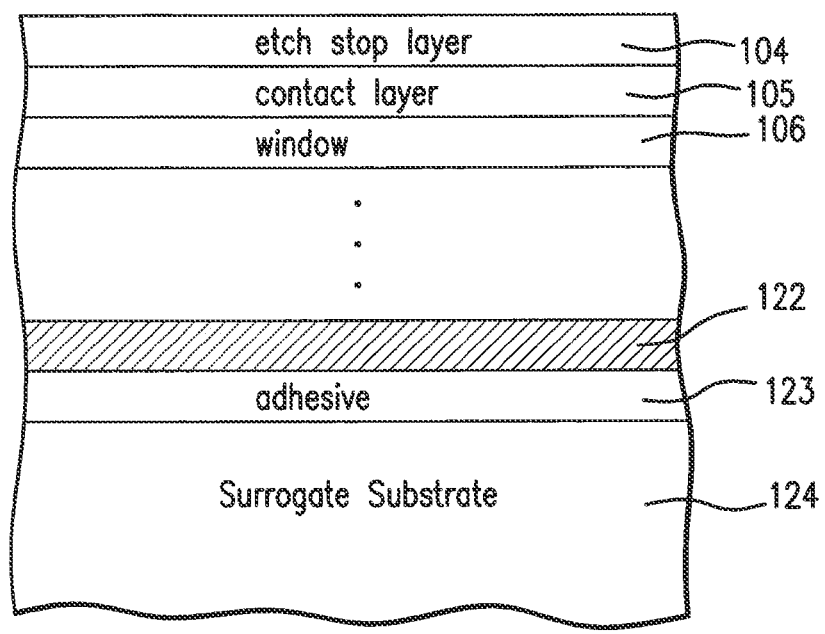
FIG. 8 is a cross-sectional view of the solar cell of FIG. 5B after the next process step according to the present invention.

FIG. 8 is a cross-sectional view of the solar cell of FIG. 5B after the next process step according to the present invention in which the sacrificial buffer layer has been removed with 4 citric 1 $H_2O_2$ solution.

Figure 9:
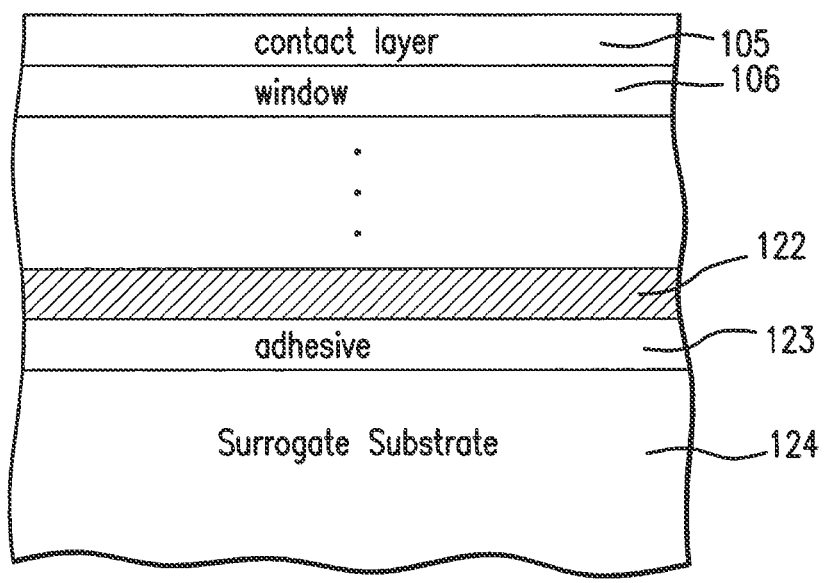
FIG. 9 is a cross-sectional view of the solar cell of FIG. 8 after the next process step according to the present invention.

FIG. 9 is a cross-sectional view of the solar cell of FIG. 8 after the next process step according to the present invention in which the etch stop layer 104 is removed by $HCl/H_2O$ solution.

Figure 10:
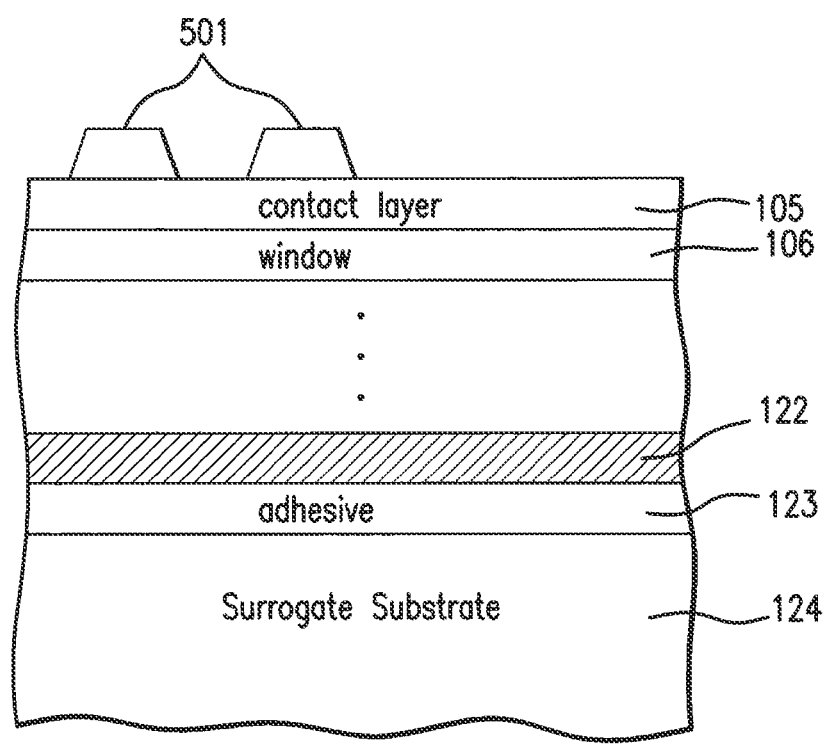
FIG. 10 is a cross-sectional view of the solar cell of FIG. 9 after the next process step according to the present invention.

FIG. 10 is a cross-sectional view of the solar cell of FIG. 9 after the next process step according to the present invention in which a photoresist mask (not shown) is placed over the contact layer 105 as the first step in forming the grid lines 501. The mask 200 is lifted off to form the grid lines 501.

Figure 11:
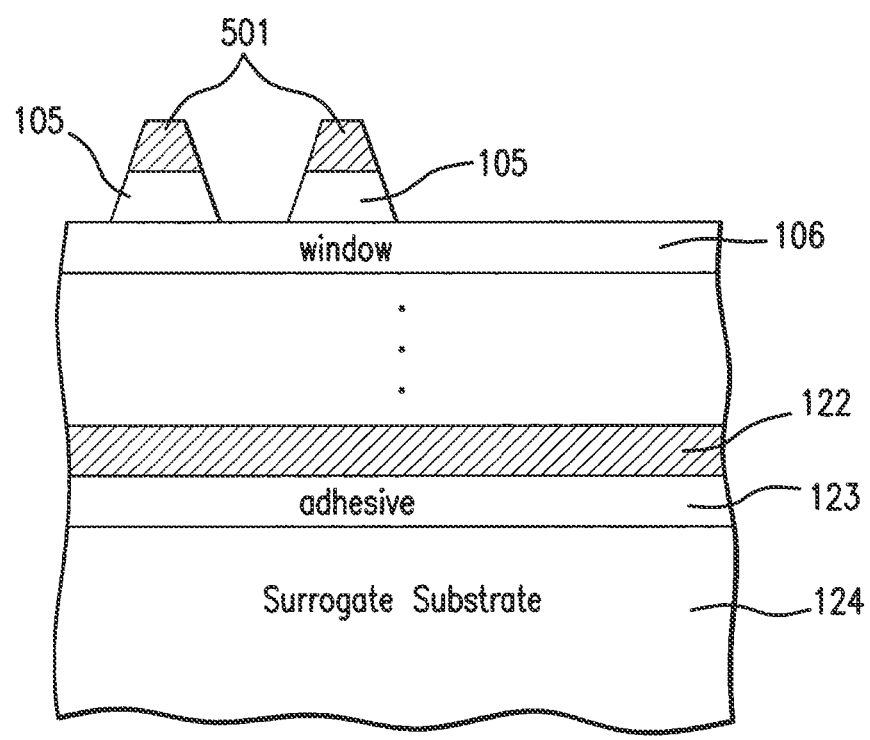
FIG. 11 is a cross-sectional view of the solar cell of FIG. 10 after the next process step according to the present invention.

FIG. 11 is a cross-sectional view of the solar cell of FIG. 10 after the next process step according to the present invention in which grid lines 501 are deposited via evaporation and lithographically patterned and deposited over the contact layer 105. The grid lines are used as a mask to etch down the surface to the window layer 106 using a citric acid/peroxide etching mixture.

Figure 12:
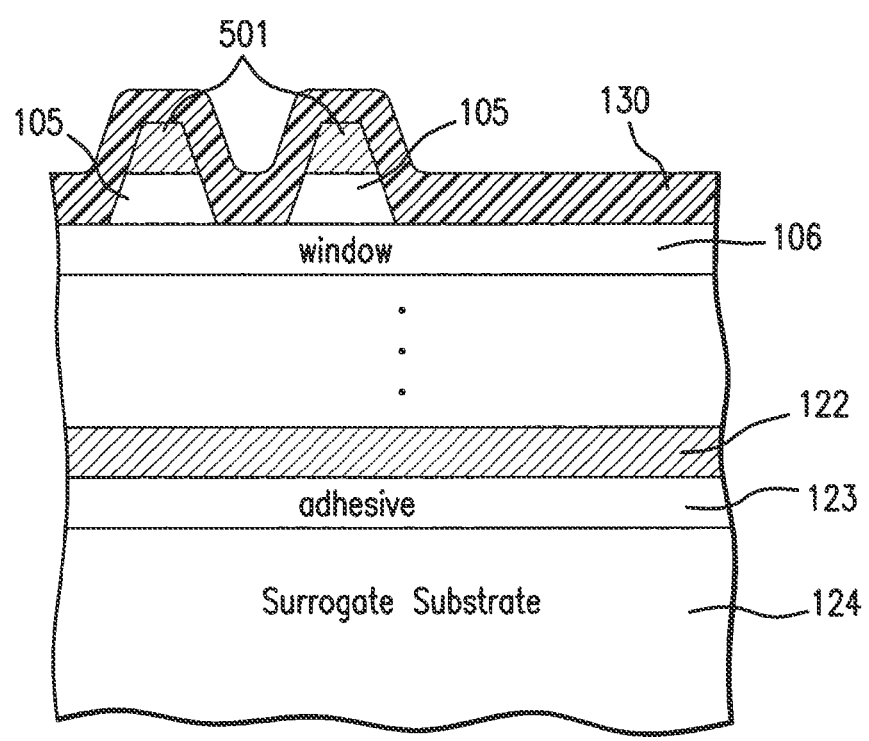
FIG. 12 is a cross-sectional view of the solar cell of FIG. 11 after the next process step according to the present invention.

FIG. 12 is a cross-sectional view of the solar cell of FIG. 11 after the next process step according to the present invention in which an antireflective (ARC) dielectric coating layer 130 is applied over the entire surface of the "bottom" side of the wafer with the grid lines 501.

Figure 13:
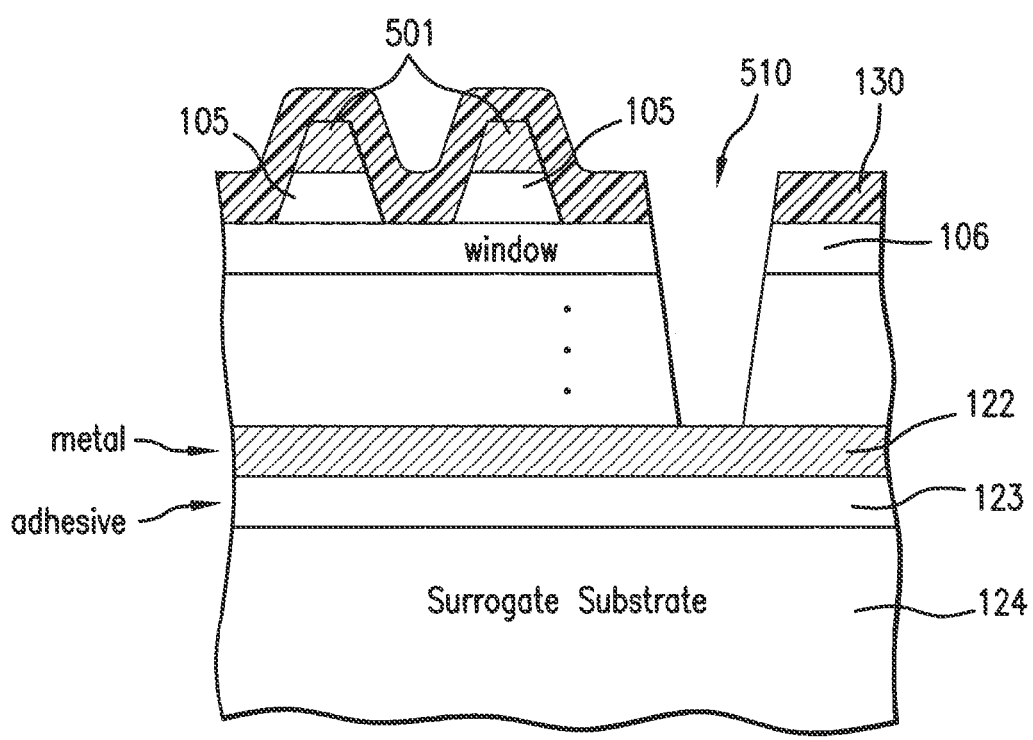
FIG. 13 is a cross-sectional view of the solar cell of FIG. 12 after the next process step according to the present invention.

FIG. 13 is a cross-sectional view of the solar cell of FIG. 12 after the next process step according to the present invention in which the mesa 501 is etched down to the metal layer 122 using phosphide and arsenide etchants. The cross-section in the figure is depicted as seen from the A-A plane shown in FIG. 7.

One or more silver electrodes are welded to the respective contact pads.

Figure 14:
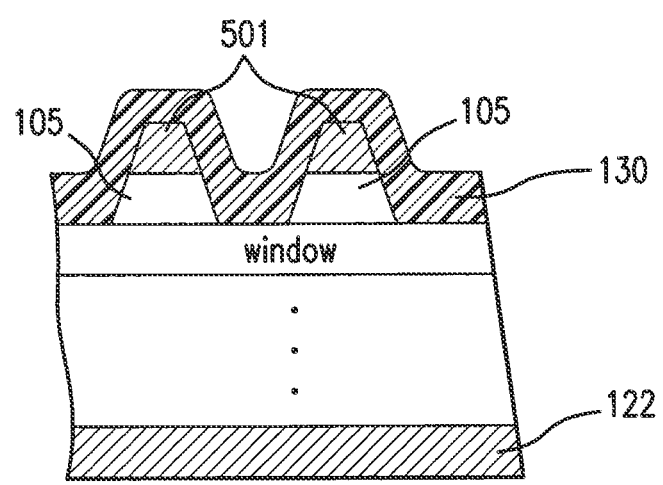
FIG. 14 is a cross-sectional view of the solar cell of FIG. 13 after the next process step according to the present invention.

FIG. 14 is a cross-sectional view of the solar cell of FIG. 13 after the next process step according to the present invention after the surrogate substrate 124 and adhesive 123 are removed by EKC 922. Perforations are made over the surface, each with a diameter is 0.033 inches and separated by 0.152 inches.

The perforations allow the flow of etchant through the surrogate substrate 124 to permit its lift off.

Figure 15:
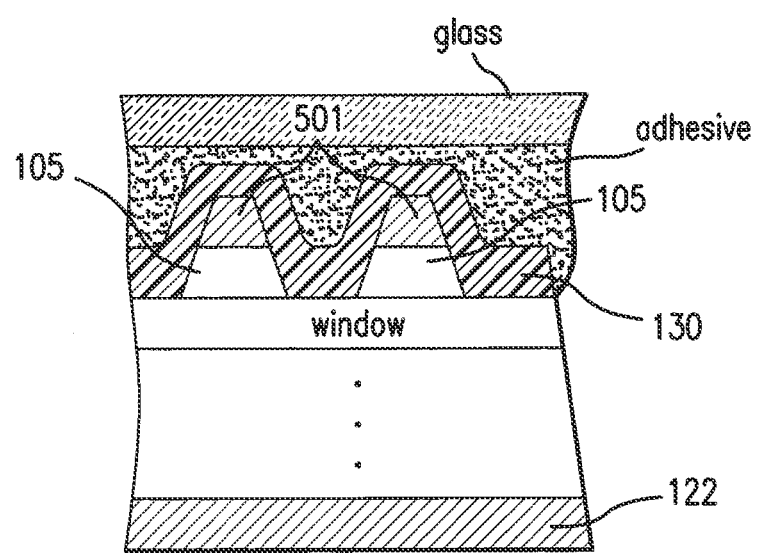
FIG. 15 is a cross-sectional view of the solar cell of FIG. 14 after the next process step according to the present invention.

FIG. 15 is a cross-sectional view of the solar cell of FIG. 14 after the next process step according to the present invention in which an adhesive is applied over the ARC layer 130 and a coverglass attached thereto.

It will be understood that each of the elements described above, or two or more together, also may find a useful application in other types of constructions differing from the types of constructions differing from the types described above.

While the invention has been illustrated and described as embodied in a multijunction solar cell, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A method of forming a multijunction solar cell comprising an upper subcell, a middle subcell, and a lower subcell, the method comprising:
   providing a first substrate composed of GaAs or Ge for the epitaxial growth of semiconductor material;
   growing a first solar subcell on said first substrate having a first band gap;
   growing a second solar subcell over said first subcell having a second band gap smaller than said first band gap;
   growing a tunnel diode layer over the second solar subcell;
   growing an InGaAs buffer layer over the tunnel diode layer, wherein the buffer layer is composed of a crystalline structure, the crystalline structure of the buffer layer consisting of indium, gallium and arsenic; and
   growing an InGaAlAs grading interlayer on the InGaAs buffer layer, wherein the InGaAlAs grading interlayer is composed of multiple layers each of which has a crystalline structure, wherein the crystalline structure of each of the multiple layers of the grading interlayer consists of indium, gallium, arsenic and aluminum, and wherein the InGaAlAs grading interlayer has a constant third band gap greater than the second band gap; and
   growing a third solar subcell over said grading interlayer having a fourth band gap smaller than said second band gap such that said third solar subcell is lattice mismatched with respect to said second solar subcell,
   wherein the InGaAlAs grading interlayer achieves a transition in lattice constant from the second subcell to the third subcell.

2. A method of forming a multijunction solar cell as defined in claim 1, wherein the buffer layer has a thickness of about 1 micron.

3. A method of forming a multijunction solar cell as defined in claim 1 wherein the constant band gap of the grading interlayer is 1.5 eV, the first solar subcell is composed of InGa(Al)P, the second solar subcell includes an InGaP emitter layer, and the third solar subcell is composed of $In_{0.30}GaAs$.

4. A method of forming a solar cell as defined in claim 1 further comprising:
    depositing a bottom contact layer composed of a sequence of Ti/Au/Ag/Au layers over said third solar subcell;
    attaching a surrogate second substrate which is perforated with holes over said bottom contact layer; and
    subsequently removing the first substrate by a sequence of lapping and/or etching steps.

5. A method of forming a solar cell as defined in claim 1 further comprising:
    forming a contact layer over said first substrate; and
    subsequent to removing the first substrate, depositing grid lines over the contact layer by evaporation and lithographically patterning.

6. A method of forming a solar cell as defined in claim 5 further comprising attaching a coverglass over the solar cell.

7. A method of forming a solar cell as defined in claim 1 further comprising etching said solar cell so as to form a mesa etched around the periphery of the solar cell.

8. A method of forming a multijunction solar cell as defined in claim 1, wherein the buffer layer is grown directly on the tunnel diode layer.

9. A method of forming a multijunction solar cell as defined in claim 1, wherein the tunnel diode layer is part of a p++/n++ tunnel diode.

* * * * *